(12) United States Patent
Silvano De Sousa et al.

(10) Patent No.: US 10,939,563 B2
(45) Date of Patent: Mar. 2, 2021

(54) FLAME RETARDANT STRUCTURE FOR COMPONENT CARRIER

(71) Applicant: AT&S Austria Technologie & Systemtechnik Aktiengesellschaft, Leoben (AT)

(72) Inventors: Jonathan Silvano De Sousa, Vienna (AT); Markus Leitgeb, Trofaiach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/365,089

(22) Filed: Mar. 26, 2019

(65) Prior Publication Data

US 2019/0223298 A1 Jul. 18, 2019

Related U.S. Application Data

(63) Continuation-in-part of application No. PCT/EP2017/074499, filed on Sep. 27, 2017.

(30) Foreign Application Priority Data

Sep. 27, 2016 (DE) ...................... 10 2016 118 273.7

(51) Int. Cl.
*H05K 1/03* (2006.01)
*H05K 3/46* (2006.01)
(Continued)

(52) U.S. Cl.
CPC ......... *H05K 3/4655* (2013.01); *H05K 1/0207* (2013.01); *H05K 1/0353* (2013.01);
(Continued)

(58) Field of Classification Search
CPC .. H05K 1/0353; H05K 1/0373; H05K 3/4688; H05K 3/4691; H05K 3/4694; H05K 3/4655
See application file for complete search history.

(56) References Cited

U.S. PATENT DOCUMENTS

| 4,713,284 A | 12/1987 | Hasegawa et al. |
| 5,412,160 A | 5/1995 | Yasumoto et al. |
(Continued)

FOREIGN PATENT DOCUMENTS

| CN | 101232774 A | 7/2008 |
| CN | 202425193 U | 9/2012 |
(Continued)

OTHER PUBLICATIONS

Dardel, Blaise et al.; Communication in Application No. 17777868.5; May 15, 2020; pp. 1-8; European Patent Office; 2280 HV Rijswijk, Netherlands.
(Continued)

*Primary Examiner* — Jeremy C Norris
(74) *Attorney, Agent, or Firm* — Robert A. Blaha; Smith Tempel Blaha LLC

(57) ABSTRACT

A method of manufacturing a constituent for a component carrier is disclosed. The method includes providing an electrically conductive structure, forming a highly thermally conductive and electrically insulating or semiconductive structure on the electrically conductive structure, and subsequently, attaching a thermally conductive and electrically insulating structure, having a lower thermal conductivity than the highly thermally conductive and electrically insulating or semiconductive structure, on an exposed surface of the highly thermally conductive and electrically insulating or semiconductive structure.

15 Claims, 4 Drawing Sheets

(51) Int. Cl.
*H05K 1/02* (2006.01)
*H05K 1/18* (2006.01)

(52) U.S. Cl.
CPC ............ *H05K 1/181* (2013.01); *H05K 1/186* (2013.01); *H05K 3/4688* (2013.01); *H05K 1/185* (2013.01); *H05K 2201/012* (2013.01); *H05K 2201/017* (2013.01); *H05K 2201/0175* (2013.01); *H05K 2201/0179* (2013.01)

(56) References Cited

U.S. PATENT DOCUMENTS

| | | | |
|---|---|---|---|
| 5,889,233 | A | 3/1999 | Shimoto et al. |
| 6,323,436 | B1* | 11/2001 | Hedrick ............... H01L 23/145 |
| | | | 174/255 |
| 6,414,847 | B1 | 7/2002 | Hutchison et al. |
| 2005/0003199 | A1* | 1/2005 | Takaya ............... H01F 17/0006 |
| | | | 428/413 |
| 2009/0191387 | A1 | 7/2009 | Paul et al. |
| 2010/0025095 | A1 | 2/2010 | Guo et al. |
| 2011/0127562 | A1 | 6/2011 | Sung et al. |
| 2012/0305301 | A1 | 12/2012 | Lee |
| 2013/0105956 | A1 | 5/2013 | Jo et al. |
| 2013/0199825 | A1 | 8/2013 | Bruderer et al. |
| 2014/0144677 | A1* | 5/2014 | Wang .................. H05K 1/0206 |
| | | | 174/252 |
| 2015/0146379 | A1 | 5/2015 | Katz et al. |
| 2017/0019990 | A1* | 1/2017 | Takemura .......... G01R 1/07342 |

FOREIGN PATENT DOCUMENTS

| | | |
|---|---|---|
| CN | 104159393 A | 11/2014 |
| CN | 204090272 U | 1/2015 |
| EP | 1 622 432 A2 | 2/2006 |
| JP | H0699538 A | 4/1994 |
| JP | H071655 A | 1/1995 |
| JP | 2015085897 A | 5/2015 |
| JP | 6005730 B2 | 10/2016 |
| WO | WO2012152364 A1 | 11/2012 |
| WO | 2015151809 A1 | 10/2015 |
| WO | WO2016020398 A1 | 2/2016 |

OTHER PUBLICATIONS

Surmet Engineering Better Materials—Aluminum Nitride (AlN) Ceramic Material; downloaded on Aug. 4, 2020 from http://www.surmet.com/technology/aln/index.php; 2 pp.; Surmet Engineering 2018.

* cited by examiner

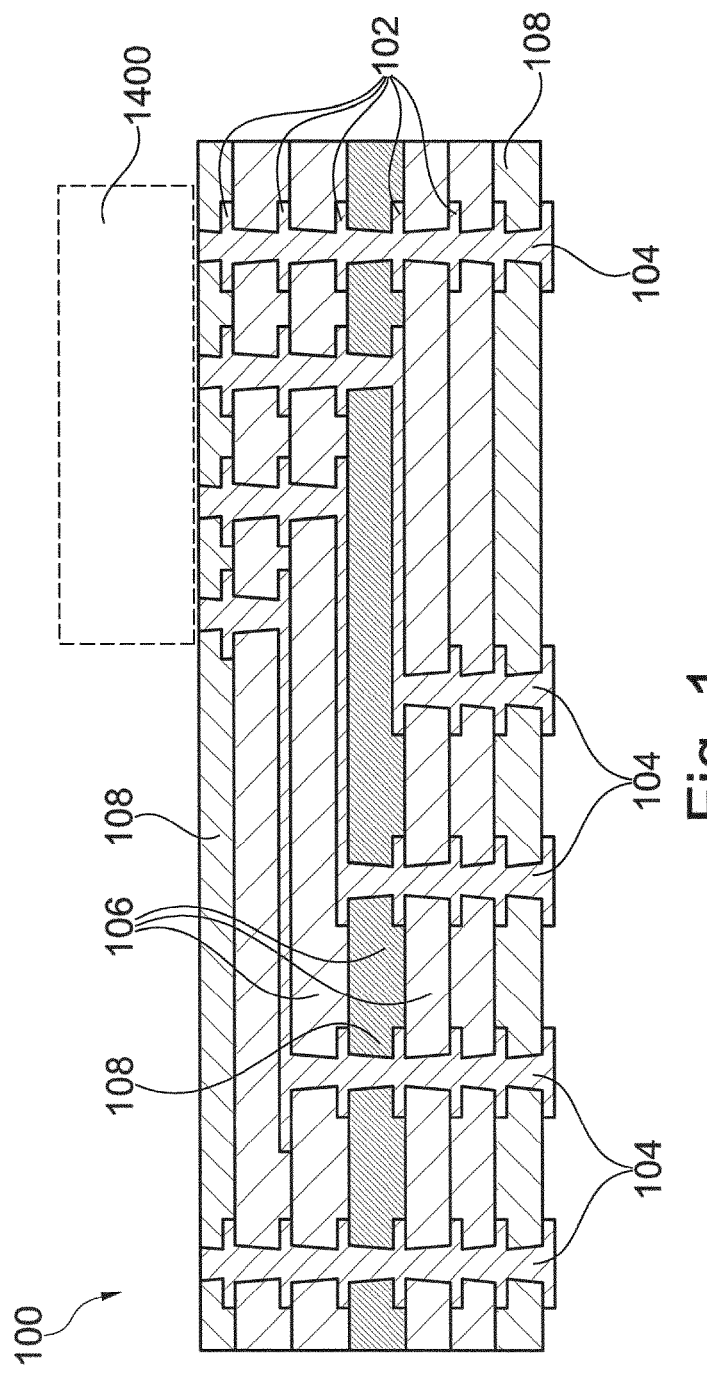
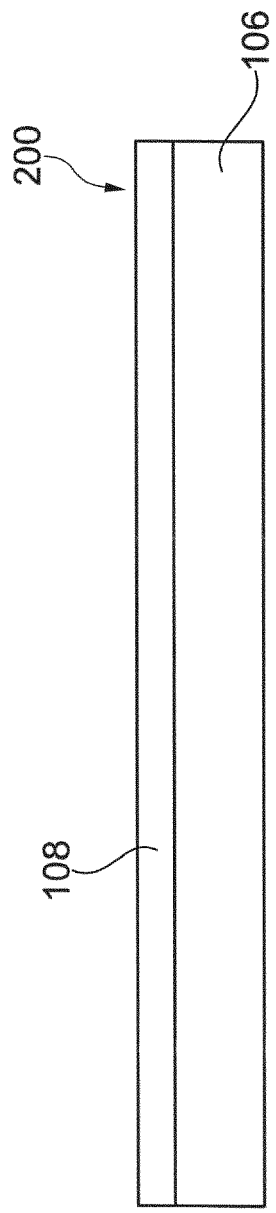
Fig. 1
Fig. 2

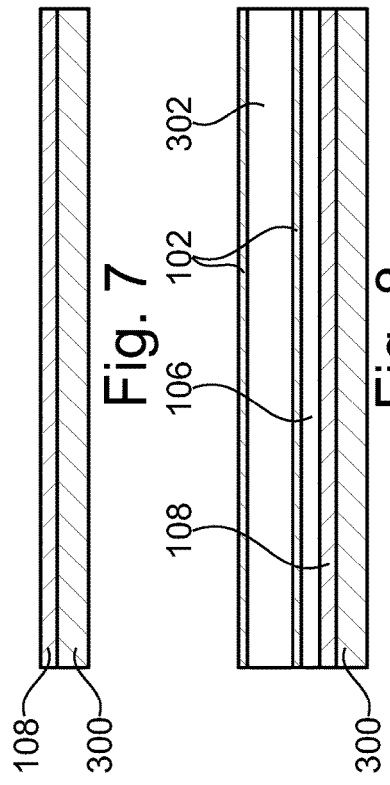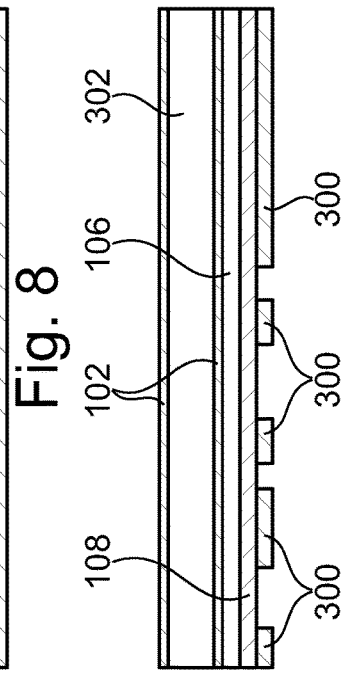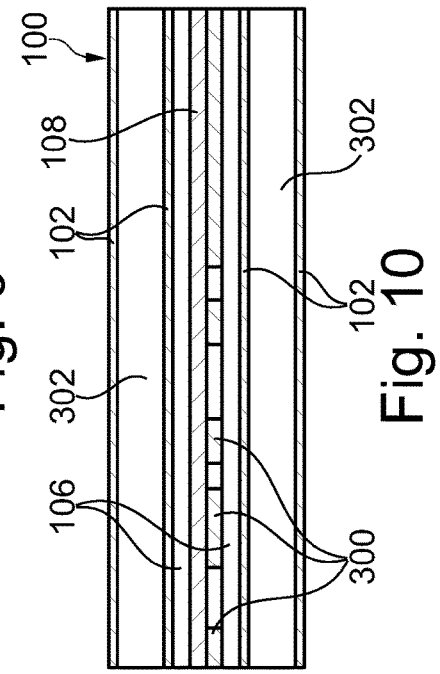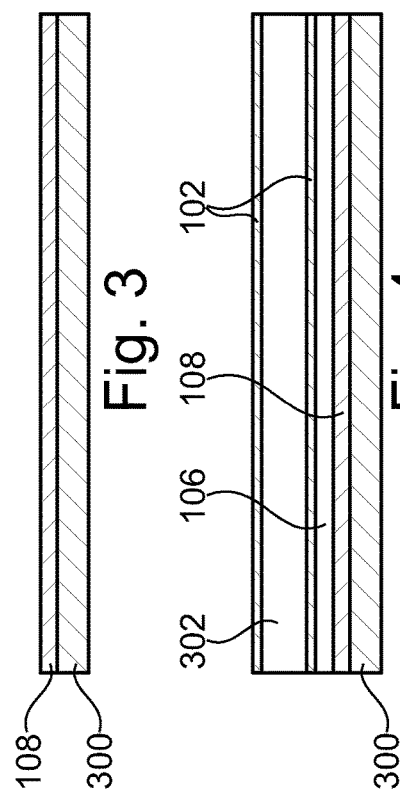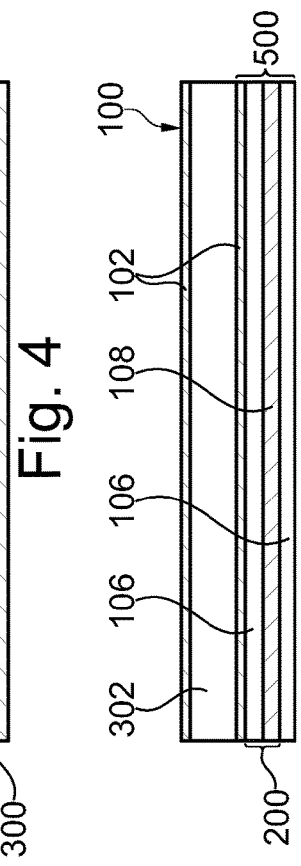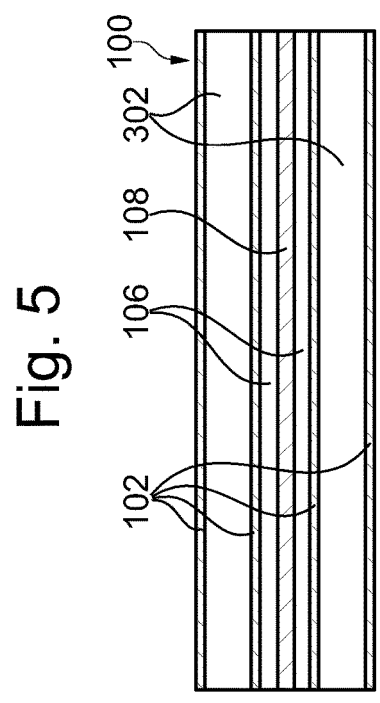

FLAME RETARDANT STRUCTURE FOR COMPONENT CARRIER

TECHNICAL FIELD

The invention relates to a manufacturing method and to a method of manufacturing a component carrier. Furthermore, the invention relates to a constituent for a component carrier, to a component carrier, and to a method of use.

TECHNOLOGICAL BACKGROUND

Along with the development of electronic industries, electronic products have a trend towards miniaturization and high performance, and accordingly multi-layer boards are developed so as to meet demands for high-density integrated circuits and meanwhile reduce the thickness of packaging substrates. In modern applications of component carrier technology, sophisticated electronic functionality is implemented. This also involves high power and high voltage applications. Thus, significant amounts of heat can be generated by one or more components mounted on and/or embedded within a component carrier such as a printed circuit boards (PCB). This may have an impact on operation safety. Conventional approaches of tackling this challenge are based on considerations of improving heat removal, i.e. to efficiently dissipate heat generated during operation.

Conventional PCBs rely merely on FR4 and copper as heat spreading structures. FR4 serves as mechanical body and dielectric in PCB build up. Although FR4 is thermally conductive to a certain extent, its heat conductivity is not very high (typically around 0.5 W/mK). For that reason, the heat is mainly dissipated via the copper structures.

Although existing component carriers are powerful, there is still room for improvement in terms of improving operation safety.

SUMMARY

There may be a need to enable the manufacture of reliable component carriers with high operation safety.

A manufacturing method, a method of manufacturing a component carrier, a constituent for a component carrier, a component carrier, and a method of use according to the independent claims are provided.

According to an exemplary embodiment of the invention, a component carrier for carrying at least one component is provided, wherein the component carrier comprises a plurality of electrically conductive layer structures, and a plurality of electrically insulating layer structures, wherein the plurality of electrically conductive layer structures and the plurality of electrically insulating layer structures form a laminated stack, and wherein at least one of the electrically insulating layer structures is configured as a flame retard-ant structure.

According to another exemplary embodiment of the invention, a meth-od of manufacturing a component carrier for carrying at least one component is provided, wherein the method comprises forming a laminated stack of a plurality of electrically conductive layer structures and a plurality of electrically insulating layer structures, and configuring at least one of the electrically insulating layer structures as a flame-retardant structure.

According to still another exemplary embodiment of the invention, a manufacturing method is provided which comprises providing an electrically conductive structure, forming a flame-retardant structure on the electrically conductive structure, subsequently attaching an electrically insulating layer structure on an exposed surface of the flame-retardant structure, and removing at least part of the electrically conductive structure.

According to yet another exemplary embodiment of the invention, a constituent for a component carrier is provided, wherein the constituent comprises or consists of a flame-retardant structure, and an electrically insulating layer structure attached on a surface of the flame-retardant structure (optionally, the constituent may additionally comprise a patterned electrically conductive structure).

According to yet another exemplary embodiment of the invention, at least one constituent having the above-mentioned features or at least one inorganic flame-retardant structure is used as one or more electrically insulating layer structures of a component carrier.

Overview of Embodiments

In the context of the present application, the term "flame-retardant structure" may particularly denote a physical structure made of a material and being shaped, dimensioned and arranged for preventing or even completely disabling propagation or even enabling the self-extinguishing of fire along the component carrier, in particular for disabling fire from moving beyond the flame-retardant structure.

In the context of the present application, the term "sacrificial structure" may particularly denote a temporary base structure or an auxiliary structure which does not, not necessarily or not entirely form part of a readily manufactured component carrier but is mainly used during its manufacturing process as a sufficiently robust base or support for forming a flame retardant structure thereon, and which may be capable of withstanding high temperature conditions which may be involved in the manufacture of a flame retardant structure. After having formed the flame-retardant structure and after having connected the latter to an electrically insulating layer structure, the sacrificial structure can be either used again for manufacturing further constituents for component carriers, may remain at least partially part of the readily manufactured component carrier, or may be disposed or removed completely, i.e. sacrificed.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

According to an exemplary embodiment of the invention, a component carrier is provided in which a flame-retardant structure for preventing propagation of fire along the component carrier is integrated. Such a flame-retardant structure may a be a specifically configured electrically insulating material which is shaped, dimensioned and arranged on and/or in the component carrier so that the tendency of the component carrier to start burning even in the presence of an external fire or excessive heat generated during operation of the component carrier is significantly reduced or even rendered impossible. Also, the material selection of the flame-retardant structure may contribute to this function. Thus, the mentioned flame retard-ant structure can functionally operate in a similar way as a fire protection door in a building. The flame-retardant structure of the component carrier therefore forms a barrier disabling fire from propagating within an interior of the component carrier beyond the flame-retardant structure. In particular, the flame-retardant structure may suppress propagation of fire from the component carrier towards an environment, or in the opposite direction. By integrating such a flame-retardant structure in the component carrier, the operation safety of the component carrier can be significantly improved, in particular for high power and/or high voltage applications.

According to an exemplary embodiment of the invention, a constituent for a component carrier such as a printed circuit board is provided which is electrically insulating (and preferably additionally thermally conductive) and simultaneously provides a flame-retardant function. As a material for a flame-retardant structure, ceramic layers (such as layer of metal oxides and metal nitrides) have turned out to be highly appropriate. However, formation of such materials directly on an electrically insulating structure of the component carrier, typically made of prepreg or FR4, is not easily possible, since formation of such a flame-retardant structure in many cases involves high temperature procedures such as CVD (chemical vapor deposition). The high temperatures occurring during such a deposition procedure of forming the flame-retardant structure may be incompatible with the maximum temperature which electrically insulating material such as prepreg or FR4 may withstand. Therefore, one embodiment of the invention is related to a manufacturing method in which an electrically conductive structure (such as a copper foil) is used as a sacrificial structure on which the flame-retardant structure is formed. Electrically conductive material such as copper is usually able to withstand and is therefore usually compatible with the high processing temperatures of forming flame retardant structures. Subsequently, the electrically insulating structure can be connected to the flame-retardant structure, for instance by lamination. For example, bi-stage resin of the electrically insulating structure can be converted into a cured state by the application of pressure and heat, whereby also a reliable connection between the flame-retardant structure and the electrically insulating structure may be formed. The electrically conductive sacrificial structure may later be removed partially or entirely. By such a manufacturing procedure, a constituent for the design of fire protected component carriers such as printed circuit boards can be provided which can simply substitute conventionally implemented prepreg layers to provide at the same time a proper electrically insulating and flame-retardant function.

In the following, further exemplary embodiments of the manufacturing method, the method of manufacturing a component carrier, the constituent for a component carrier, the component carrier, and the method of use will be explained.

In an embodiment, the flame-retardant structure provides a flame retarding function so that the component carrier is in accordance with fire protection classification UL94-V0. UL94 is a standard for safety of flammability of plastic materials for parts in devices and appliances testing. UL 94 is a plastics flammability standard released by Underwriters Laboratories of the USA. The standard specifies plastics according to how they burn in various orientations and thicknesses. UL94-V0 means that burning stops within 10 seconds on a vertical specimen, wherein drips of particles are allowed as long as they are not inflamed. Correspondingly, the flame-retardant structure may provide a flame retarding function so that the component carrier is in accordance with fire protection classification IEC/DIN EN 60695-11-10 and/or IEC/DIN EN 60695-11-20 (in particular in the most recent version at the priority date of the present application). In order to achieve compliance with such fire protection classifications, the amount (in terms of mass and/or volume), the shape and the positioning of the respective one or more flame retardant structures within the component carrier can be specifically adapted. For instance, a fully circumferential coverage of an external surface of the component carrier by the flame-retardant structure may be advantageous. Furthermore, the flame-retardant structure may be provided with a thickness which disables a heat source (for instance an embedded component) from causing a fire on or in the component carrier due to the fire suppressing function of the flame-retardant structure. Another advantageous configuration of the flame-retardant structure is to circumferentially directly cover a heat source, for instance an embedded component. Furthermore, one or more full layers of the flame-retardant material may be particularly efficient as an impenetrable barrier for a propagating fire, or as a set of such barriers.

In an embodiment, a volume percentage of a partial volume of the flame-retardant structure divided by an entire volume of the electrically insulating layer structures is at least 0.5%, in particular at least 5%. Thus, when the mentioned amounts of flame-retardant materials are met or exceeded, propagation of fire through the component carrier may be rendered impossible.

In an embodiment, the volume percentage of the partial volume of the flame-retardant structure divided by the entire volume of the electrically insulating layer structures is not more than 50%, in particular not more than 10%. This allows to maintain the general advantageous properties of conventionally used dielectric material of a component carrier, such as low cost and a functional contribution to a lamination procedure.

In an embodiment, a material of the flame-retardant structure comprises at least one of the group consisting of an inorganic material, a ceramic, a metal oxide, a metal carbide, a metal nitride, aluminum oxide, aluminum nitride, and diamond like carbon (DLC). Conventionally, such materials have only been considered and configured for heat removal properties. However, it has been found by the present inventors that these materials, when provided with suitable shape, at a suitable location and with a suitable thickness and amount, they can be configured to serve as a flame-retardant structure. Since the arrangement of the mentioned materials directly on electrically insulating material of a component carrier (in particular directly on a resin matrix, in particular an epoxy resin matrix, with embedded reinforcement (such as fabric, fibres) in particular with embedded glass fibers) is at least very difficult in view of the high temperature involved during the deposition of the mentioned materials of the flame retardant structure, the possibility of depositing such materials on electrically conductive materials such as a copper foil, for example as a sacrificial structure, can be considered as highly advantageous.

In an embodiment, the flame-retardant structure comprises a plurality of, in particular at least five, more particularly at least ten, separate flame-retardant layers spaced relative to one another over the component carrier (in particular over a stacking direction of the laminate type component carrier). It has turned out that providing a sufficiently large number of substantially full layers of flame-retardant material distributed over a component carrier is a very efficient architecture of achieving compliance even with strict flame-retardant classifications. More particularly, coverage of external surfaces of the component carrier by flame retardant material, including coverage of main surfaces and/or lateral surfaces of the component carrier, is specifically efficient. However, it is also possible that the frame retardant structure is formed by only one layer.

In an embodiment, at least part of the flame-retardant structure is made of a porous material, i.e. a material comprising a large number of pores or voids, in particular being interconnected with one another, in its interior. For example, porous ceramics such as porous aluminum oxide and/or porous aluminum nitride may be implemented. Without wishing to rebound to a specific theory, it is presently believed that the formation of pores in the interior of the respective flame-retardant structure further inhibits propagation of fire through a flame-retardant structure. Although the formation of pores may reduce the thermal conductivity of the flame-retardant structure, it is nevertheless advantageous to promote the flame-retardant properties.

In an embodiment, at least part of the flame-retardant structure is directly sandwiched between two glass fiber free portions of the plurality of electrically insulating layer structures. Such an embodiment is particularly advantageous, because glass-free (for instance pure resin) dielectric layers have a high tendency of burning in the event of thermal heat, since glass fibers which usually suppress the tendency to burn are lacking in such a material configuration. However, it has turned out that interposing a flame-retardant structure between two glass-free resin comprising dielectric structures provides, as a whole, a flame-retardant protection.

In an embodiment, one of the two glass fiber free portions forms part of a Resin Coated Copper (RCC) structure or an epoxy based build up film (e.g., Anjinomoto Bond Film, ABF). A RCC structure is a layer sequence of a copper foil coated with a resin (in particular an epoxy resin) without glass fibers therein. Such an RCC structure is highly advantageous for certain printed circuit board applications and other component carrier applications, but has conventionally the drawback that it has a high tendency of burning in the presence of fire. However, by laminating a flame-retardant layer with an RCC foil, a composite structure is obtained which has the capability of providing, as a whole, a flame-retardant arrangement.

In an embodiment, the other one of the two glass fiber free portions is a solder stop mask. A solder stop mask (also denoted as solder mask or solder resist) may be a thin lacquer-like or varnish-like layer of film type of polymer which can be applied to the copper traces of a printed circuit board (PCB) for protection against oxidation and to prevent solder bridges from forming between closely spaced solder pads. Also, a solder-stop mask or solder-stop material/layer is usually made of resin material without glass fibers. Therefore, also in such a context, the provision of a flame-retardant structure laminated to such a solder stop material/layer improves the flame-retardant properties of the component carrier as a whole.

In an embodiment, the flame-retardant structure is configured as a flame-retardant layer structure, i.e. as one or multiple complete or patterned layers. In particular, such a flame-retardant layer structure may be provided with a single layer thickness of less than or equal to 10 µm, more particularly with a thickness of less than or equal to 5 µm, even more particularly with a thickness in a range between 100 nm and 5 µm. The mentioned layer thicknesses, which can be obtained by deposition procedures such as CVD when forming ceramic layers or the like, have turned out to be sufficient to establish a flame-retardant property without a significant influence on the overall physical properties of a component carrier. In particular, even differences in the coefficient of thermal expansion (CTE) of different constituents of a component carrier are therefore only influenced to a minor, and in many cases acceptable, extent.

In an embodiment, at least part of the flame-retardant structure is in direct contact with material of at least one of the electrically insulating layer structures. This is advantageous, since a dielectric double barrier disabling flow of electric current in this region may be provided by taking this measure. Although the direct formation of a flame-retardant structure on an electrically insulating structure is difficult in view of the high processing temperatures and the high thermal sensitivity of thermally conductive and electrically insulating material, the above-described concept of a sacrificial structure of sufficient thermal robustness is particularly advantageous.

In an embodiment, at least part of the flame-retardant structure is in direct contact with and separates different ones of the electrically conductive layer structures. A sandwich of a flame-retardant structure between two copper foils is easy to manufacture, since a direct manufacture of flame-retardant structures on electrically conductive layer structures is possible without challenges concerning compliance with high processing temperatures.

In an embodiment, at least part of the flame-retardant structure is configured as a substantially continuous layer. Thus, no weak points in terms of fire propagation are involved in a continuous flame-retardant layer.

In an embodiment, at least part of the flame-retardant structure is configured as a plurality of coplanar sub-structures filling gaps of a patterned layer constituting one of the electrically conductive layer structures. Therefore, it is also possible to fill out any gaps in an electrically conductive patterned structure with flame retardant material to provide the flame-retardant function specifically there.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as rein-forced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component may be surface mounted and/or embedded and may be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the flame-retardant structure is optically transparent. In such a configuration, the component carrier is capable of fulfilling also an optical function, for instance the transmission of electromagnetic radiation in the visible range.

In an embodiment, the flame-retardant structure is formed on the electrically conductive structure at a high temperature which is incompatible with integrity of the electrically insulating layer structure, in particular at a temperature above 300° C. For instance, the mentioned high temperature may be above 300° C., in particular above 400° C. These are typical manufacturing temperatures of ceramic layers having flame retardant properties in a sufficient thickness and when being located at an appropriately selected position within the component carrier.

In an embodiment, the flame-retardant structure is formed on the electrically conductive structure by at least one of the group consisting of sputtering, physical vapor deposition, chemical vapor deposition, plasma enhanced chemical vapor deposition, application of nanoparticles, sintering, and electric arc deposition. However, other manufacturing methods are possible as well.

In an embodiment, the attaching of the electrically insulating layer structure on the exposed surface of the flame-retardant structure is accomplished by lamination. In this context, lamination may denote a manufacturing procedure in which a stack of layer structures is made subject to elevated temperature and high pressure. Thereby, previously uncured material (such as bi-stage prepreg), in particular of the electrically insulating layer structure, can be cured (in particular may be melted and subsequently solidified) and thereby forms a connection with adjacent layer structures.

In an embodiment, prior to the attaching, the electrically insulating structure is connected to a fully cured structure (such as a core or a multi-layer). A core may be an already cured electrically insulating body (for instance made of FR4 material) in a sufficient thickness being capable of providing sufficient mechanical stability to the entire component carrier.

As an alternative to the above-described manufacturing process for the flame-retardant structure, at least part of the flame-retardant structure may also be formed by depositing the flame-retardant structure directly on one of the electrically insulating layer structures by a low-temperature deposition process.

In an embodiment, the flame-retardant structure is configured to (at least partially) suppress copper migration in the component carrier.

With respect to the technical field of power applications, it has emerged that common materials for building electrically insulating layers (for example FR4) may be not sufficient to prevent copper migration. Copper migration in turn may cause short circuits between electrically conductive (e.g. copper) layers or vias. This problem may in particular be observed in the surrounding of electric contacts of embedded (electronic) components in high power applications. It has now been surprisingly found that the problem of copper migration may be overcome (or can be at least efficiently reduced) by applying the flame-retardant structure as described above. In this manner, the long-term reliability of a printed circuit board may be increased. Said long term reliability may in particular be important with respect to e-mobility applications. The described positive effects may be further improved, when the flame-retardant structure comprises a ceramic (layer) and/or when the flame-retardant structure is configured as a (very) dense structure (e.g. in comparison to common electrically insulating layers such as FR4 material).

BRIEF DESCRIPTION OF THE DRAWINGS

FIG. 1 shows a cross-sectional view of a flame-retardant component carrier according to an exemplary embodiment of the invention.

FIG. 2 shows a cross-sectional view of a constituent for a component carrier used as a substitute for a conventional prepreg layer according to an exemplary embodiment of the invention.

FIG. 3, FIG. 4, FIG. 5 and FIG. 6 show cross-sectional views of structures obtained during performance of a method of manufacturing a component carrier according to an exemplary embodiment of the invention.

FIG. 7, FIG. 8, FIG. 9 and FIG. 10 show cross-sectional views of structures obtained during performance of a method of manufacturing a component carrier according to another exemplary embodiment of the invention.

DETAILED DESCRIPTION OF ILLUSTRATED EMBODIMENTS

Figure 11:
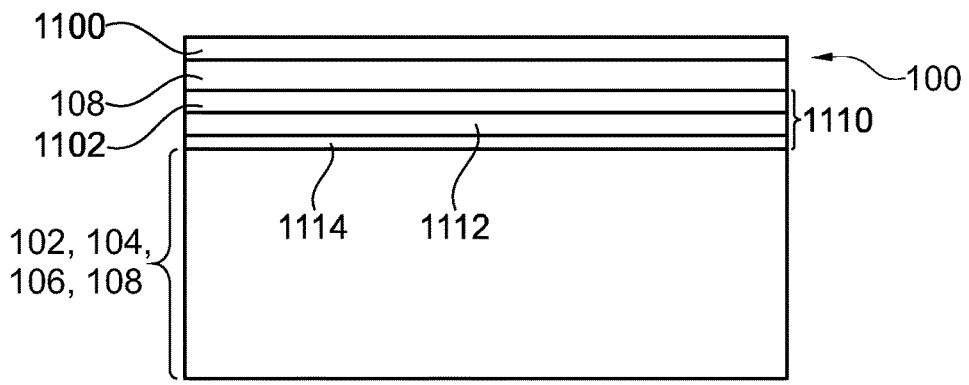
FIG. 11 shows a cross-sectional view of a component carrier with flame retardant properties according to another exemplary embodiment of the invention.

The aspects defined above and further aspects of the invention are apparent from the examples of embodiment to be described hereinafter and are explained with reference to these examples of embodiment.

The invention is described in more detail hereinafter with reference to examples of embodiment but to which the invention is not limited.

The illustrations in the drawings are schematically presented. In different drawings, similar or identical elements or features are provided with the same reference signs.

Before, referring to the drawing, exemplary embodiments will be de-scribed in further detail, some basic considerations will be summarized based on which exemplary embodiments of the invention have been developed.

According to an exemplary embodiment of the invention, a flame-retardant ultra-thin dielectric layer is provided. On this basis, a component carrier such as a PCB with one or more ultra-thin dielectric layers as flame retardant and/or adhesion promoting layer(s) may be built up.

Ceramics can be used as heat sinks for light-emitting diodes (for ex-ample aluminum nitride and aluminum oxide), in particular due to the two following characteristics: On the one hand, such materials are dielectric materials, and on the other hand such materials are good thermal conductors. A gist of an embodiment of the invention is to use thin ceramic layers that can be applied in the PCB build up to work as a third channel with high thermal conductivity, besides copper and organic constituents of the PCB, for heat dissipation purposes. The application of the thin ceramics on the PCB structure can be done with deposition methods such as PVC, PECVD, DC Arc, Sputtering, application of nanoparticles, etc.

Structures of dielectric materials may be formed in between regular layers of the PCB build up. These structures, in particular shaped as layers, can be formed with different ceramic materials (nitrides (for instance of aluminum nitride), carbides (for instance silicon carbide) and oxides (for instance zirconium oxide), for example) via PVD, PECVD, DC Arc Sputtering, application of nanoparticles, etc., or other materials like diamond like carbon (DLC). The ceramic layer can be applied in between any other layers in the PCB (in particular between FR4 and FR4, in between FR4 and copper, or between copper and copper). A particularly efficient way to apply the ceramics material can be between two Cu layers that are used also as electrical contact and, therefore, can be electrically insulated from one another by the ceramic layer in between them. The ceramics can measure about 100 nm to 5 µm thickness, and can be structured or patterned with methods such as chemical and plasma etching, for example. Another advantageous embodiment fills gaps between copper structures in the same heat spreading layer (see FIG. 12). The advantage of such ceramic materials (especially aluminum nitride) is that no adhesive promotion material (such as titanium) or pretreatment (such as ion bombardment) has to be implemented. Some ceramics can also be applied directly on copper without any pre-treatment and without adhesive promotion material. Therefore, the processing of such heat spreading layers is easier and deposition can be done anywhere. Copper can be also directly applied on the ceramics with a metallization process.

The above mentioned ultra-thin ceramic layers can be highly advantageously used as flame retardants in a PCB stack up, since ceramics will not burn and will help to dissipate the heat out of the PCB body more efficiently, thereby minimizing the risk of flame. As such layers show a very good micro-roughness, these layers may be used as adhesion promoter of copper foils to base materials with very smooth surface, which are widely used for line structuring (in a semi-additive process) or high frequency applications (for instance polytetrafluoroethylene (PTFE) materials) as well.

In an embodiment, hybridization of the PCB may be carried out. It is furthermore possible, according to an exemplary embodiment, to implement inorganic materials in the PCB build up. Moreover, it is possible to increase the heat dissipation capabilities of the PCB without adding neither significant mass nor thickness to the PCB build up (appropriate ceramic layers may have a thickness in the order of magnitude of 5 µm).

In combination with a copper foil, the deposited flame-retardant layers can be used as adhesion promoter material for very smooth base materials. Highly advantageously, these deposited layers can operate as flame retard-ants. When thermally conductive and flame-retardant layers are deposited directly on a copper foil, no sophisticated equipment is needed and easy processing is possible within the PCB manufacturing procedure. Furthermore, heat dissipation can be handled efficiently and flame propagation may be inhibited.

Exemplary applications of exemplary embodiments of the invention are automotive applications, lighting applications, applications in terms of mobile devices, as well as power electronics applications. For these and other applications, there is a demand for efficient solutions with in-board heat management. Particularly advantageously may be the implementation of flame-retardant heat spreading layers in mobile devices (such as smartphones, tablets, cameras, Power-Books, etc.).

FIG. 1 shows a cross-sectional view of a flame-retardant component carrier 100 according to an exemplary embodiment of the invention. The component carrier 100 is embodied as a printed circuit board (PCB) with a surface mounted component 1400, for instance a semiconductor chip.

The component carrier 100 carrying the component 1400 comprising a plurality of electrically conductive layer structures 102, 104. The electrically conductive layer structures 102 are patterned copper foils, whereas the electrically conductive layer structures 102 are copper filled vias, i.e. vertical interconnects for providing an electrically conductive connection between different ones of the patterned foils. Furthermore, the component carrier 100 comprises a plurality of electrically insulating layer structures 106, 108 each configured as patterned dielectric layer. The electrically conductive layer structures 102, 104 and the electrically insulating layer structures 106, 108 form a laminated stack, i.e. are connected to one another by the application of pressure, if desired supported by the supply of thermal energy or heat. The electrically insulating layer structures 106 are made of epoxy resin with glass fibers embedded therein. Upon lamination, the resin melts and resolidifies, thereby connecting the individual elements of the component carrier 100.

The electrically insulating layer structures 108, however, are configured as a dielectric, thermally conductive and flame-retardant structure 108 which may be made of a ceramic such as aluminum nitride or aluminum oxide. Such materials not only provide a high thermal conductivity, thereby promoting heat removal from an interior of the component carrier 100 to an exterior thereof, but additionally render it impossible for a fire to spread rapidly within the component carrier 100. This is accomplished by the material selection in combination with the spatial arrangement of the elements of the flame-retardant structure 108 and in combination with its shape and thickness.

The flame-retardant structure 108 provides a flame retarding function so that the component carrier 100 has an intrinsic fire protection mechanism preventing propagation of fire along the component carrier 100. In the shown embodiment, the flame-retardant structure 108 comprises two layers defining an upper main surface and a lower main surface of the component carrier 100. Furthermore, the flame-retardant structure 108 comprises a central layer providing for a fire protection and removal of thermal energy also from an interior of the component carrier 100 to an exterior thereof.

A volume percentage of a partial volume of the flame-retardant structure 108 divided by an entire volume of the electrically insulating layer structures 106, 108 may be above 10%. For further increasing the flame-retardant function of the flame-retardant structure 108, it may be made of a porous material.

Hence, the flame-retardant structure 108 is composed of three separate, substantially continuous, and flame retardant layers, being vertically spaced, along a stacking direction of the individual layer structures, relative to one another within the component carrier 100. A thickness of each individual layer of the flame-retardant structure 108 may be in a range between 100 nm and 5 µm. Each of the individual layers constituting the flame-retardant structure 108 is in direct contact with material of a respective one of the other electrically insulating layer structures 106 made of resin and fibers. At the same time, parts of the flame-retardant structure 108 are in direct contact with and separate different ones of the electrically conductive layer structures 102, 104.

FIG. 2 shows a cross-sectional view of a constituent 200 for a component carrier 100 which can be used as a substitute for a conventional prepreg layer according to an exemplary embodiment of the invention.

The constituent 200 for the component carrier 100 consists of a flame-retardant structure 108 (for instance an aluminum nitride ceramic or an aluminum oxide ceramic) having a thickness of 5 µm, and an electrically insulating layer structure 106 (for instance made of prepreg or FR4) directly attached on a surface of the flame-retardant structure 108. Since the formation of the flame retardant structure 108 with the described material selection involves high temperatures as occurring during vapor deposition or sputtering, the flame retardant structure 108 cannot be deposited directly on the electrically insulating layer structure 106 without the risk of reliability issues, since the described material selection of the electrically insulating layer structure 106 cannot withstand such high temperatures without undesired chemical or mechanical modification. Referring to FIG. 3 to FIG. 5, it will be described how such a constituent 200 can nevertheless be manufactured with high reliability.

The constituent 200 shown in FIG. 2 can be implemented in any printed circuit board design (or more generally component carrier design) to substitute a thermally conductive and electrically insulating layer (such as a prepreg layer) according to a conventional design. By taking this measure, a flame-retardant function may be implemented in a component carrier 100. In particular, each and every thermally conductive and electrically insulating layer structure of a conventional design may be substituted by a constituent 200 to thereby obtain the component carrier 100 with flame retardant function.

FIG. 3 to FIG. 6 show cross-sectional views of structures obtained during carrying out a method of manufacturing a constituent 200 as shown in FIG. 2 and finally a component carrier 100 according to an exemplary embodiment of the invention.

In order to obtain the structure shown in FIG. 3, an electrically conductive structure 300 may be provided as a base or support structure. The electrically conductive structure 300 may be a copper foil serving as a sacrificial layer during the following procedure. Subsequently, flame retardant structure 108 can be deposited on the electrically conductive structure 300, for instance by chemical vapor deposition (CVD) or sputtering. Thus, the flame-retardant structure 108 can be formed on the electrically conductive structure 300 at a high temperature of for example above 300° C. which is incompatible with mechanical and chemical integrity of prepreg (for which undesirably cross-linking might already start during formation of the flame-retardant structure 108). The copper material of the electrically conductive structure 300 however is capable of withstanding such harsh conditions during deposition of the flame-retardant structure 108 (for instance aluminum nitride).

In order to obtain the structure shown in FIG. 4, an electrically insulating layer structure 106 may be subsequently attached by lamination on an exposed surface of the flame-retardant structure 108. The electrically insulating layer 106 may for instance be a prepreg foil. Prior to the attaching, the electrically insulating structure 106 may be positioned next to a core 302 of FR4 as example for a fully cured structure. Both opposing main surfaces of the core 302 may be covered with a respective electrically conductive layer structure 102 such as a further copper foil. The electrically conductive structure 300 with the flame-retardant structure 108 thereon, the electrically insulating structure 106 and the core 302 covered on both main surfaces thereof with a respective one of the electrically conductive layer structures 102 may then be connected to one another by lamination, i.e. the application of mechanical pressure at elevated temperature. Thereby, a laminated stack of a plurality of electrically conductive layer structures 102, 300 and a plurality of electrically insulating layer structures 106, 108 is formed.

In order to obtain the structure shown in FIG. 5, the electrically conductive structure 300 is entirely removed from the remainder of the laminated stack, for instance by stripping, etching, grinding or peeling it off. After removal of the electrically conductive structure 300, the two lowermost layers of the so thinned laminated stack form the constituent 200 shown in FIG. 2. If desired, the constituent 200 may be removed from the remainder of the laminated stack and can be used as a semi-finished product for manufacturing a component carrier 100.

According to FIG. 5 however, a further electrically insulating layer structure 106 of prepreg may be connected to an exposed lower main surface of the flame-retardant structure 108. A result of this is a flame-retardant structure 108 covered on both main surfaces thereof by a respective electrically insulating layer structure 106 of prepreg, as indicated by reference numeral 500 (which can also be used as a constituent for a component carrier 100). The result of the described manufacturing procedure is the component carrier 100 shown in FIG. 5.

In order to obtain the structure shown in FIG. 6, a further core 302 is provided, wherein both opposing main surfaces of the further core 302 may be covered with a respective further electrically conductive layer structure 102 such as a further copper foil. The elements shown in FIG. 6 may be connected to one another by lamination.

Although not shown in the figures, further procedures such as via formation, patterning certain layers, embedding components, may be accomplished with the shown component carrier 100.

FIG. 7 to FIG. 10 show cross-sectional views of structures obtained during carrying out a method of manufacturing a component carrier 100 according to another exemplary embodiment of the invention.

In order to obtain the structure shown in FIG. 7 and the structure shown in FIG. 8, the same procedures as described above referring to FIG. 3 and FIG. 4 can be carried out.

In order to obtain the structure shown in FIG. 9, the electrically conductive structure 300 is however not removed entirely (as described above referring to FIG. 5), but it removed only partially by patterning. Patterning may involve a lithography and etching procedure.

In order to obtain the structure shown in FIG. 10, the four lowermost layer structures shown in FIG. 6 (see reference numerals 106, 102, 302, 102) are attached to the laminated stack shown in FIG. 9 and are interconnected by lamination. Hence, the electrically conductive structure 300 serves only partially as a sacrificial layer according to FIG. 7 to FIG. 10, and is partially maintained as a patterned electrically conductive layer in the final component carrier 100.

FIG. 11 shows a cross-sectional view of a flame-retardant component carrier 100 according to another exemplary embodiment of the invention.

According to FIG. 11, a flame-retardant structure 108 is directly sandwiched between two glass fiber free electrically insulating portions 1100, 1102 (both consisting of pure resin without fiber cloth). The lower glass fiber free electrically insulating portion 1102 forms part of a Resin Coated Copper (RCC) structure 1110 having a central copper layer 1112 covered on both main surfaces thereof with a pure resin layer (i.e., the glass fiber free electrically insulating portion 1102 and a further pure resin layer 1114). The upper glass fiber free electrically insulating portion 1100 is a solder stop mask.

FIG. 11 hence shows an embodiment of a component carrier 100 according to an embodiment of the invention in which the flame-retardant structure 108 is implemented as a substantially continuous layer between the Resin Coated Copper (RCC) structure 1110 and the varnish-type upper glass fiber free electrically insulating portion 1100. Both portions 1100, 1102 lack glass fibers and comprise, as electrically insulating material, only resin, so that they are prone to burning. However, sandwiching the flame-retardant structure 108 between the two glass fiber-free electrically insulating portions 1100, 1102 has turned out as an efficient mechanism of providing a flame retardant function of the described component carrier 100. The manufacture of the two glass fiber-free electrically insulating portions 1100, 1102 enclosing the flame retardant structure 108 can be accomplished in a similar way as shown in FIG. 3 and FIG. 4 by the use of sacrificial electrically conductive structure 300.

Figure 12:
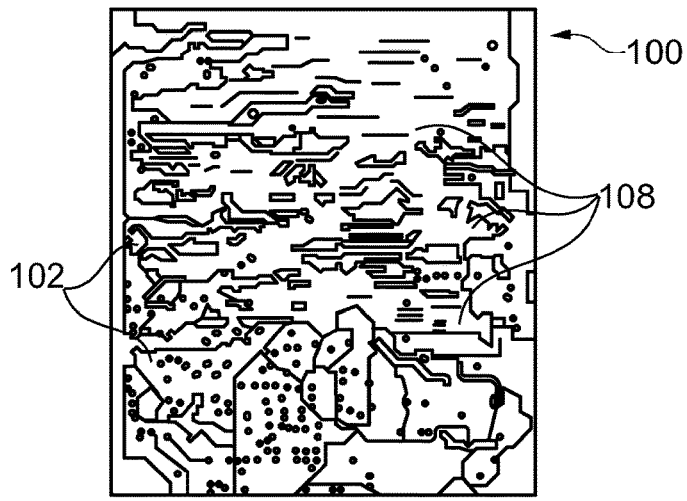
FIG. 12 shows a plan view of a layer of a component carrier with flame retardant properties according to another exemplary embodiment of the invention.

FIG. 12 shows a plan view of a layer of a flame-retardant component carrier 100 according to another exemplary embodiment of the invention. According to FIG. 12, the flame-retardant structure 108 is configured as a plurality of coplanar sub-structures filling gaps of a patterned layer constituting one of the electrically conductive layer structures 102. Voids between copper structure in the same plane are filled with a ceramic material in order to thermally connect thermally isolated regions in the copper layer and therefore improve thermal dissipation in the in-plane directions.

Figure 13:
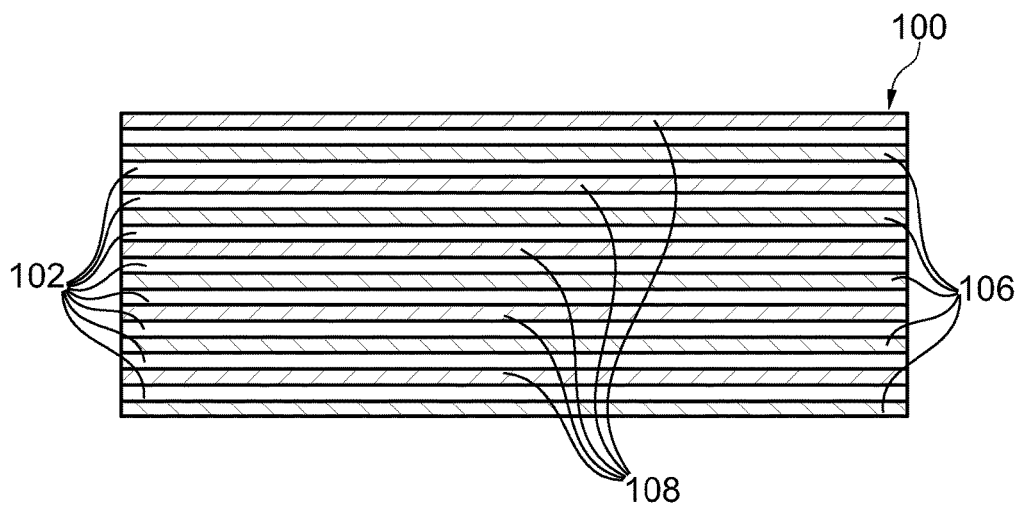
FIG. 13 shows a cross-sectional view of a component carrier with flame retardant properties according to yet another exemplary embodiment of the invention.

FIG. 13 shows a cross-sectional view of a flame-retardant component carrier 100 according to yet another exemplary embodiment of the invention. In the embodiment of FIG. 13, every second electrically insulating layer structure consists of flame-retardant material may be made of ceramic layers. Many fire barriers are provided by such a multi-layer stack. Only referring to the electrically insulating layer structures, there is an alternating stack of electrically insulating layer structures 106 made of prepreg and electrically insulating flame-retardant structures 108 made of aluminum oxide or the like.

Figure 14:
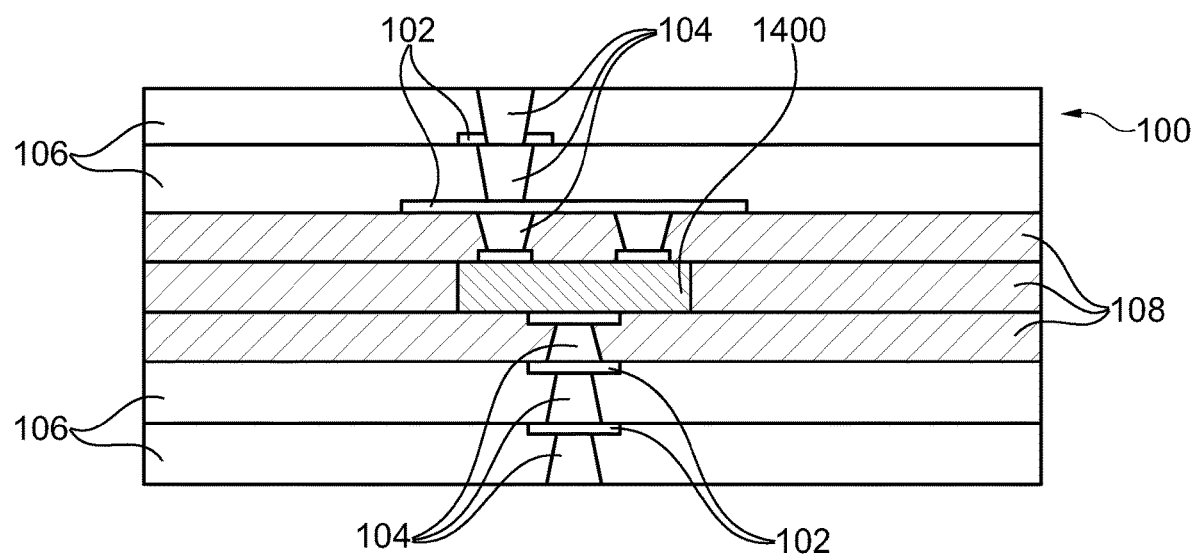
FIG. 14 shows a cross-sectional view of a component carrier with flame retardant properties and having an embedded component according to another exemplary embodiment of the invention.

FIG. 14 shows a cross-sectional view of a flame-retardant component carrier 100 according to another exemplary embodiment of the invention. According to FIG. 14, a flame-retardant structure 108 is composed of multiple flame-retardant layers which are arranged in the component carrier 100 so that a power electronics chip as component 1400 embedded in the component carrier 100 is completely circumferentially (and hence substantially hermetically) embedded in flame retardant material. This ensures that the heat source (and therefore also potential fire source), i.e. the embedded component 1400, is completely surrounded by flame retardant material of the flame-retardant structure 108. When the flame-retardant structure 108 is made of a highly thermally conductive material, heat may also be efficiently removed from the component carrier 100 to an environment.

Figure 15:
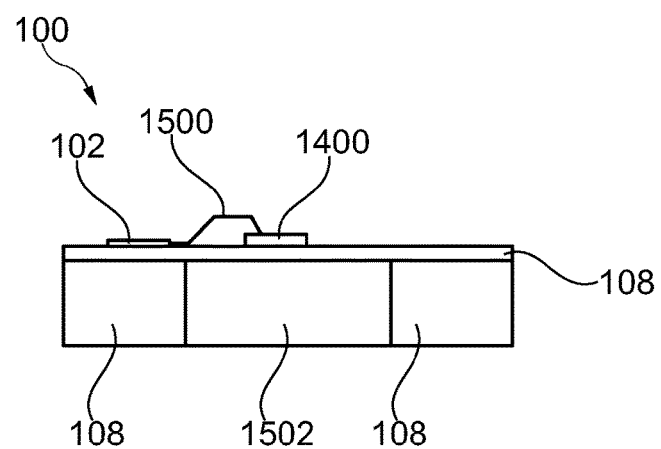
FIG. 15 shows a cross-sectional view of a component carrier with surface mounted light-emitting diode according to an exemplary embodiment of the invention.

FIG. 15 shows a cross-sectional view of an entire component carrier 100 with surface mounted light-emitting diode as component 1400 according to an exemplary embodiment of the invention.

According to FIG. 15, pads of the light-emitting diode are contacted via a bond wire 1500 and are thereby electrically connected to a patterned copper layer (see reference numeral 102) on top of the aluminum nitride layer (see reference numeral 108). Although not shown in FIG. 15, a bottom of the shown embodiment may be connected to a heat sink.

During operation, the light emitting diode generates light and heat. The light transmits the transparent highly thermally conductive and electrically insulating or semiconductive structure 106 and is reflected by the polished aluminum structure constituted by reference numeral 1502 and propagates upwards so that its light energy is not lost. Any heat dissipated during operation of the light emitting diode can be efficiently removed by the heat removing and heat spreading function of the flame-retardant structures 108.

Although not shown in FIG. 15, electrically insulating layer structures 106, for instance from prepreg or FR-4, may be present in the component carrier 100 as well.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier for carrying at least one component, comprising:
  a plurality of electrically conductive layer structures; and
  a plurality of electrically insulating layer structures;
  wherein the plurality of electrically conductive layer structures and the plurality of electrically insulating layer structures form a laminated stack;
  wherein at least one of the electrically insulating layer structures is configured as a flame-retardant structure preventing propagation of fire along the component carrier;
  wherein a material of the flame-retardant structure is at least one of the group consisting of an inorganic material, a ceramic, a metal oxide, a metal carbide, a metal nitride, aluminum oxide, aluminum nitride, and diamond like carbon;
  wherein at least part of the flame-retardant structure is directly sandwiched between two glass fiber free portions of the plurality of electrically insulating layer structures; and
  wherein one of the two glass fiber free portions forms part of a Resin Coated Copper structure or an epoxy based build up film.

2. The component carrier according to claim 1, wherein the flame-retardant structure provides a flame-retarding function so that the component carrier is in accordance with fire protection classification UL94-V0.

3. The component carrier according to claim 1, wherein a volume percentage of a partial volume of the flame-retardant structure divided by an entire volume of the electrically insulating layer structures is at least 0.5%.

4. The component carrier according to claim 1, wherein the flame-retardant structure comprises a plurality of separate flame-retardant layers spaced relative to one another within the component carrier.

5. The component carrier according to claim 1, wherein at least part of the flame-retardant structure is made of a porous material.

6. The component carrier according to claim 1, wherein one of the two glass fiber free portions is a solder-stop mask.

7. The component carrier according to claim 1, wherein the flame-retardant structure is configured as a flame-retardant layer structure with a single layer thickness of less than or equal to 10 μm.

8. The component carrier according to claim 1, wherein at least part of the flame-retardant structure is in direct contact with material of at least one other of the electrically insulating layer structures.

9. The component carrier according to claim 1, wherein at least part of the flame-retardant structure is in direct contact with and separates different ones of the electrically conductive layer structures.

10. The component carrier according to claim 1, comprising at least one of the following features:
  wherein at least part of the flame-retardant structure is configured as a substantially continuous layer;
  wherein at least part of the flame-retardant structure is configured as a plurality of coplanar sub-structures filling gaps of a patterned layer constituting one of the electrically conductive layer structures.

11. The component carrier according to claim 1, wherein the flame-retardant structure is configured to suppress copper migration in the component carrier.

12. The component carrier according to claim 1, comprising at least one of the following features:
  the component carrier has surface mounted thereon and/or embedded therein at least one component being selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip;
  the plurality of electrically conductive layer structures comprise at least one of the group of metals consisting of copper, aluminum, nickel, silver, gold, palladium, and tungsten, any of the group of metals being optionally coated with graphene;
  at least one of the plurality of electrically insulating layer structures comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;
  the component carrier is configured as one of the group consisting of a printed circuit board, and a substrate;
  the flame-retardant structure is optically transparent.

13. A method of manufacturing a component carrier for carrying at least one component, the method comprising:
  forming a laminated stack of a plurality of electrically conductive layer structures and a plurality of electrically insulating layer structures; and configuring at least one of the electrically insulating layer structures as a flame-retardant structure preventing propagation of fire along the component carrier;

wherein a material of the flame-retardant structure is at least one of the group consisting of an inorganic material, a ceramic, a metal oxide, a metal carbide, a metal nitride, aluminum oxide, aluminum nitride, and diamond like carbon; and configuring the flame-retardant structure to suppress copper migration in the component carrier.

14. The method according to claim 13, comprising at least one of the following features:

wherein at least part of the flame-retardant structure is formed by;

providing an electrically conductive structure;

forming a flame-retardant structure, preventing propagation of fire, on the electrically conductive structure;

subsequently, attaching an electrically insulating layer structure on an exposed surface of the flame-retardant structure;

removing at least part of the electrically conductive structure;

wherein at least part of the flame-retardant structure is formed by depositing the flame-retardant structure directly on another one of the electrically insulating layer structures by a low-temperature deposition process.

15. A component carrier for carrying at least one component, comprising:

a plurality of electrically conductive layer structures; and a plurality of electrically insulating layer structures;

wherein the plurality of electrically conductive layer structures and the plurality of electrically insulating layer structures form a laminated stack;

wherein at least one of the electrically insulating layer structures is configured as a flame-retardant structure preventing propagation of fire along the component carrier:

wherein a material of the flame-retardant structure is at least one of the group consisting of an inorganic material, a ceramic, a metal oxide, a metal carbide, a metal nitride, aluminum oxide, aluminum nitride, and diamond like carbon; and wherein the flame-retardant structure is configured to suppress copper migration in the component carrier.

* * * * *